Oct. 14, 1969 KAZUNOBU KURIHARA ET AL 3,472,779

PIEZOELECTRIC CERAMIC MATERIALS

Filed Nov. 15, 1967 2 Sheets-Sheet 1

BY Kazunobu Kurihara
Noburu Ichinose
Yoshikazu Tanno
Katsunori Yokoyama

INVENTORS

George B. Oujevolk
Attorney

Kazunobu Kurihara
Noboru Ichinose
Yoshikazu Tanno
BY Katsunori Yokoyama
INVENTOR.
George B. Oujevolk
Attorney United States Patent Office 3,472,779

Patented Oct. 14, 1969

3,472,779

PIEZOELECTRIC CERAMIC MATERIALS

Kazunobu Kurihara, Noboru Ichinose, Yoshikazu Tanno, and Katsunori Yokoyama, Yokohama-shi, Japan, assignors to Tokyo Shibaura Electric Co., Ltd., Kawasaki-shi, Japan, a corporation of Japan Filed Nov. 15, 1967, Ser. No. 683,254
Claims priority, application Japan, Nov. 22, 1966, 41/76,374
Int. Cl. C04b *35/48, 35/46*
U.S. Cl. 252—62.9 2 Claims

ABSTRACT OF THE DISCLOSURE

A piezoelectric ceramic material consisting of 40 to 50 mol percent of $PbTiO_3$, 0.5 to 6 mol percent of a compound represented by a general formula $Ba(MeNb)_{0.5}O_3$, where Me being an element selected from the group consisting of In, Y, La, Nd, Eu, Sm, Gd, Tb, Dy, Ho, Er, Tm, Yb and Lu, and the remainder of $PbZrO_3$. The material is characterised by its high electromechanical coupling coefficient of more than 40% and a high bulk density of more than 7.5 g./cm.$^3$.

This invention relates to piezoelectric materials having piezoeffect and more particularly to ferroelectric ceramic material of the lead-zirconium-titanium series.

One of the known piezoelectric materials consists of a solid solution of lead titanate and lead zirconate which is represented by the following general formula:

(1) $Pb(Ti_xZr_{(1-x)})O_3$

This material, however, has a poor electromechanical coupling coefficient, for example, less than 40%, even when the material consists of a composition shown by said general formula wherein $x$ is in a range of from 0.45 to 0.50 which exhibits the most favourable piezoelectric characteristic due to a morphotropic phase transition.

Materials having compositions represented by the following general Formulae 2 and 3 which are modifications of said Formula 1, (2) $Pb(Ti_{x'}Zr_{(1-x'-y')}Sn_{y'})O_3$ (3) $Pb(Ti_{(1-a-b)}Zr_aSn_b)O_3$ and materials having compositions wherein a portion of Pb of the compositions represented by said Formulae 1 and 3 are replaced by less than 30 mol percent of Sr, Ba or Ca are also known in the art. Although these materials have improved electromechanical coupling coefficient over the material of the composition represented by Formula 1 when powders of constituents of these compositions are sintered by powder metallurgy technique to obtain ceramic articles, high sintering temperatures are required owing to their insufficient sinterability and yet sintered articles obtained have relatively large porosity.

It has been proposed to incorporate oxides of trivalent or pentavalent metals such as $Sb_2O_3$ and $Nb_2O_5$ to the composition shown by Formula 1. These materials accompany evaporation loss of the PbO component which has the lowest boiling point during its sintering, and changes in the composition will cause the desired piezoelectric characteristic to vary.

This invention contemplates providing a novel piezoelectric ceramic material of lead zirconate-lead titanate series consisting of 40 to 50 mol percent of $PbTiO_3$, 0.5 to 6 mol percent of $Ba(MeNb)_{0.5}O$ (where Me represents an element selected from the group consisting of In, Y, La, Na, Sm, Eu, Gd, Tb, Dy, Ho, Er, Tm, Yb and Lu) and the remainder of $PbZrO_3$. A portion of $PbTiO_3$ may be substituted by less than 10 mol percent, based on the total quantity of the material of $BaTiO_3$.

When sintered under ordinary temperature conditions, the piezoelectric material shows high electromechanical coupling coefficients of more than 40% and high bulk densities of more than 7.5 g./cm.$^3$.

This invention can be more fully understood from the following detailed description taken in connection with the accompanying drawings, in which.

The proportion of each component of the novel piezoelectric ceramic material is selected to give sufficient physical properties, especially high electromechanical coupling coefficient to the material.

Figure 1:
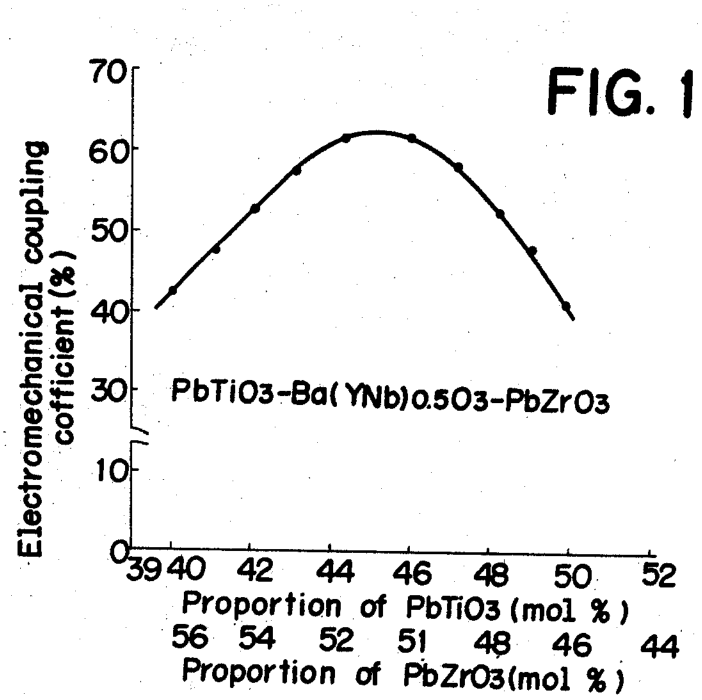
FIG. 1 shows a graph representing the relation between electromechanical coupling coefficient and varying ratios of $PbTiO_3$ and $PbZrO_3$ of the piezoelectric material according to this invention.

When the material contains 40 to 50 mol percent of $PbTiO_3$ component it has electromechanical coupling coefficient Kr of more than 40% suitable for many practical applications. For example, FIG. 1 shows variation in Kr for various proportions of $PbTiO_3$ and $PbZrO_3$ in a composition containing 4 mol percent of $Ba(YNb_{0.5}O_3$. In this composition, proportions of $PbTiO_3$ of 45.5% and $PbZrO_3$ of 50.5% gives highest Kr whereas $PbTiO_3$ of less than 40% and in excess of 50% lowers Kr to less than 40%.

Figure 2:
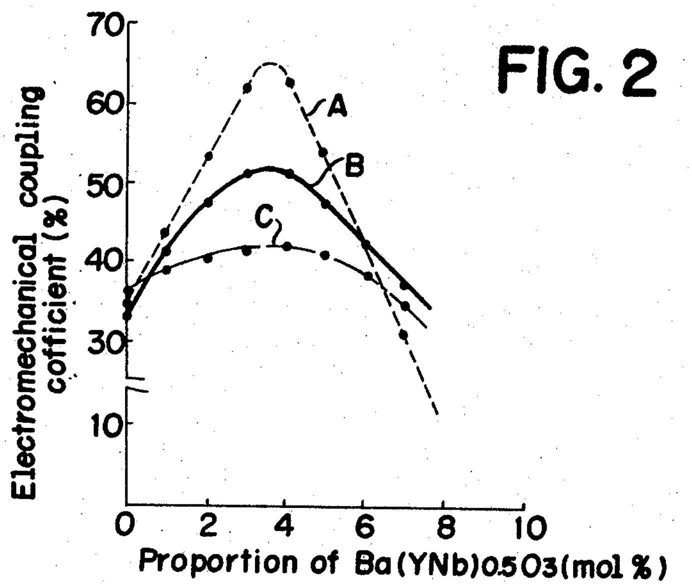
FIG. 2 is a graph showing the relation between electromechanical coupling coefficient and $Ba(YNb)_{0.5}O_3$ for three types of the materials.

In order that the piezoelectric material may have desirable Kr of more than 40%, the proportion of $Ba(MeNb)_{0.5}O_3$ should be in a range of from 0.5 to 6 mol percent. FIG. 2 shows the relation between $Ba(MeNb)_{0.5}O_3$ and Kr. In this figure curve A shows the result of measurement made of a material consisting of 45.0 mol percent of $PbTiO_3$, various amounts of $Ba(YNb)_{0.5}O_3$ and the remainder of $PbZrO_3$, curve B shows the result of a material of the similar composition except that the proportion of $PbTiO_3$ is 48.0 mol percent and curve C shows that of a material containing 41.0 mol percent of $PbTiO_3$. As can be noted from these curves, materials containing from 0.5 to 6 mol percent of $Ba(MeNb)_{0.5}O_3$ exhibit a value of Kr exceeding 40%.

In materials represented by the general formula $Ba(MeNb)_{0.5}O_3$, Me represents an element selected from the group consisting of In, Y, La, Nd, Sm, Eu, Gd, Tb, Dy, Ho, Er, Tm, Yb and Lu. Each of these elements belongs to Group III of the Periodic Table and when incorporated into the material according to said general formula greatly improves Kr.

Figure 3:
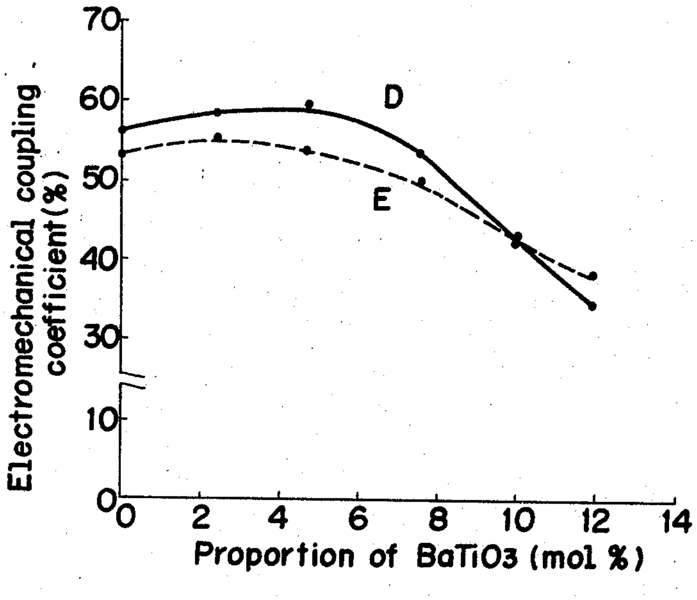
FIG. 3 is a graph to show the electromechanical coupling coefficient of two materials, a portion of $PbTiO_3$ thereof has been replaced by varying amount of $BaTiO_3$.

A portion of $PbTiO_3$ may be replaced by $BaTiO_3$ of the amount not exceeding 10 mol percent of the total compositions of the material. Materials containing $BaTiO_3$ within this range provide excellent Kr of more than 40% together with improved values of dielectric constant. It was found that although increase in the proportion of $BaTiO_3$ contributes to proportional improvements of dielectric constant, proportions in excess of 10 mol percent decrease Kr to less than 40%. Curves D and E of FIG. 3 show the relation between the proportion of $BaTiO_3$ and Kr of two materials of this invention when a portion of $PbTiO_3$ is substituted by $BaTiO_3$ of varying proportions. Curve D shows the result of measurement made on a material consisting of 48 mol percent of $PbTiO_3$, 4 mol percent of $Ba(YNb)_{0.5}O_3$ and the remainder of $PbZrO_3$, whereas curve E shows that of a material consisting of 43 mol percent of $PbTiO_3$, 4 mol percent of $Ba(YNb)_{0.5}O_3$ and the remainder of $PbZrO_3$, in both materials a portion of $PbTiO_3$ being substituted by varying proportions of $BaTiO_3$. While there is a slight difference dependent upon variations in composition where the proportion of $BaTiO_3$ exceeds 10 mol percent, Kr of the material is lowered to less than 40%.

The piezoelectric materials can be manufactured by the powder metallurgy technique like conventional materials of the same type. According to the most common method, a granular material of the average particle size of about 0.5 to 1 micron is used as the raw material which is moulded into the desired configuration, and then sintered at a temperature ranging from 1200 to 1300° C., for example. In order to facilitate moulding, the raw material may contain a solution of a resinous binder such as an aqueous solution of polyvinyl alcohol. This resinous binder undergoes decomposition and vapourizes off from the raw material when heated to the sintering temperature.

The raw material may be a mixture which consists of compounds including elements in such proportions as to produce the above described oxide upon sintering. Generally, the compound may be oxides, hydroxides, carbonates or oxalates. Preferably, after mixing, these compounds are burned prior to sintering at a temperature ranging from 600 to 900° C. and then pulverised.

It is advantageous to sinter the raw material in a sealed furnace in order to avoid variation of the proportion of components due to vapourization.

When compared with materials of conventional composition prepared from powdered raw materials having the same particle size and sintered at the same temperature, the sintered materials of this invention have a larger bulk density. It is presumed that this is caused by the fact that presence of $Ba(MeNb)_{0.5}O_3$ having the perovskite structure contributes to the improvement of the sinterability of the raw material. For example, $Ba(YNb)_{0.5}O_3$ has the perovskite structure wherein the lattice constant *a* is equal to 8.43 angstroms. When a raw material which has an average particle size of 0.5 to 1 micron is sintered at a temperature ranging from 1250 to 1300° C., the sintered material has a bulk density of 7.5 g./cm.$^3$ or higher. This should be compared with materials of conventional compositions having bulk densities of less than 7.0 g./cm.$^3$ even when sintered at temperatures exceeding 1300° C. Such an excellent sinterability will permit use of lower sintering temperatures whereby loss of most volatile PbO can be avoided.

The piezoelectric materials of this invention have another advantage that the variation in piezoelectric characteristic with the variation of the proportion of the components is very small. This alleviates conditions for mixing the raw material and for sintering thus assuring materials having uniform piezoelectric characteristic. Generally, from the result of experiments, variations in the proportion of the respective components of less than ±0.5% does not materially affect the piezoelectric characteristic of the material. Further, with respect to the piezoelectric characteristic the novel materials are stable against temperature variation as well as elapse of time after pulverization, such a stability contributes to improve reliability of the material.

The following specific examples are given by way of illustration and are not to be construed as limiting in any way the specific scope and spirit of the invention. In the examples, bulk density is given by a value ot 26° C. whereas dielectric constant and dielectric loss are given by values measured by an alternating current having a frequency of 1 kc./sec.

EXAMPLE 1

200.9 g. of PbO, 14.83 g. of BaO, 36.8 g. of $TiO_2$, 61.5 g. of $ZrO_2$, 2.26 g. of $Y_2O_3$ and 2.62 g. of $Nb_2O_5$ were mixed and pulverised in a ball mill, burned at a temperature of 700° C. for 90 minutes and again pulverised in a ball mill. The average particle size of this powder was about 1 micron. The powder was then mixed with a suitable quantity of an aqueous solution of polyvinyl alcohol and moulded into a circular disc having a diameter of 13 mm. and a thickness of 1 mm., by pressing under a pressure of 1000 kg./cm.$^2$. The disc was sintered in a sealed furnace by heating it to a temperature of 1280° C. for one hour. The disc obtained had a bulk density of 7.58 g.//cm.$^3$, a Curie temperature $T_c$ of 300° C., and a composition consisting of 40.0 mol percent of $PbTiO_3$, 6.0 mol percent of $BaTiO_3$, 4.0 mol percent of $Ba(YNb)_{0.5}O_3$ and the remainder of $PbZrO_3$. A pair of electrodes were attached to this to measure its dielectric properties, and obtained as dielectric constant ($\epsilon$) of 1510 and dielectric loss (tan $\delta$) of 1.3%.

This disc was then polarised at 140° C. by applying a DC voltage of 4 kv. across it for one hour. After standing it in atmospheric air for one week, its piezoelectric characteristics were measured and obtained the following result:

Electromechanical coupling coefficient Kr: 62.3% (27° C.).

Mechanical quality factor: 120.

EXAMPLE 2

Similar to Example 1, 198.7 g. of PbO, 16.9 g. of BaO, 39.0 g. of $TiO_2$, 60.5 g. of $ZrO_2$, 1.38 g. of $In_2O_3$ and 1.33 g. of $Nb_2O_5$ were burned and pulverised. The granular raw material obtained was moulded into a disc having a diameter of 13 mm. and a thickness of 1 mm. by pressing under a pressure of 1000 kg./cm.$^2$. This disc was sintered by heating to a temperature of 1260° C. for 90 minutes. The sintered disc had a composition consisting of 40.0 mol percent of $PbTiO_3$, 9.0 mol percent of $BaTiO_3$, 2.0 mol percent of $Ba(InNb)_{0.5}O_3$ and the balance of $PbZrO_3$. Its bulk density was 7.60 g./cm.$^3$ and its Curie temperature $T_c$ was 295° C.

Electrical characteristics were as follows:

$\epsilon$=1780
tan $\delta$=1.5%
$\rho$=$10^{10}$ ohm-cm.
Kr=43.1%
Qm=180

EXAMPLE 3

Similar to Example 1, 217.7 g. of PbO, 1.27 g. of BaO, 36.2 g. of $TiO_2$, 64.1 g. of $ZrO_2$, 0.66 g. of $La_2O_3$ and 0.57 g. of $Nb_2O_5$ were burned, moulded and then sintered at a temperature of 1240° C. for two hours. A resulted circular disc shaped piezoelectric material had a bulk density D of 7.65 g./cm.$^3$, and a Curie temperature of 338° C.

$\epsilon$=1330
tan $\delta$=2.1%
$\rho$=$10^{10}$ ohm-cm.
Kr=53.2%
Qm=163

EXAMPLE 4

213.9 g. of PbO, 6.14 g. of BaO, 36.1 g. of $TiO_2$, 62.9 g. of $ZrO_2$, 2.75 g. of $Nb_2O_5$ and 3.37 g. of $Nd_2O_3$ were pulverised and mixed in a ball mill, burned at a temperature of about 800° C., moulded into a circular disc having a diameter of 13 mm. and a thickness of 1 mm. by pressing under a pressure of 1000 kg./cm.$^2$ and then sintered by heating to a temperature of 1270° C. for one hour. The composition of this disc was comprised by 45.0 mol percent of $PbTiO_3$, 4.0 mol percent of $Ba(NdNb)_{0.5}O_3$ and the remainder of $PbZrO_3$.

EXAMPLE 5

As in Example 4, $Nd_2O_3$ was substituted by 3.41 g. of $Sm_2O_3$, and the material is sintered to obtain a circular disc having a composition consisting of 45.0 mol percent of $PbTiO_3$, 4.0 mol percent of $Ba(SmNb)_{0.5}O_3$ and the remainder of $PbZrO_3$.

EXAMPLE 6

As in Example 4, 3.50 g. of $Gd_2O_3$ was substituted for $Nd_2O_3$ and a similar ceramic containing 4.0 mol percent of $Ba(GdNb)_{0.5}O_3$ was obtained.

EXAMPLE 7

As in Example 4, in lieu of $Nd_2O_3$, 3.52 g. of $Tb_2O_3$ was used and a similar ceramic containing 4.0 mol percent of $Ba(TbNb)_{0.5}O_3$ was obtained.

EXAMPLE 8

As in Example 4, $Nd_2O_3$ was replaced by 3.56 g. of $Dy_2O_3$ to obtain a similar piezoelectric material containing 4.0 mol percent of $Ba(DyNb)_{0.5}O_3$ was obtained.

EXAMPLE 9

As in Example 4, 3.63 g. of $Ho_2O_3$ was substituted for $Nd_2O_3$ and a similar ceramic containing 4.0 mol percent of $Ba(HoNb)_{0.5}O_3$ was obtained.

EXAMPLE 10

As in Example 4, $Nd_2O_3$ component was substituted by 3.63 g. of $Tm_2O_3$ to obtain a ceramic disc containing 4.0 mol percent of $Ba(TmNb)_{0.5}O_3$.

EXAMPLE 11

As in Example 4, $Nd_2O_3$ was replaced by 3.71 g. of $Yb_2O_3$ to prepare a similar ceramic containing 4.0 mol percent of $Ba(YbNb)_{0.5}O_3$.

EXAMPLE 12

As in Example 4, $Nd_2O_3$ was substituted by 3.42 g. of $Eu_2O_3$ to obtain a piezoelectric disc containing of 4.0 mol percent of $Ba(EuNb)_{0.5}O_3$.

Physical characteristics of various piezoelectric materials prepared according to Examples 4 through 11 were as follows.

| | D(g./cm.³) | ε | Kr(percent) | Qm |
|---|---|---|---|---|
| Example: | | | | |
| 4 | 7.63 | 1,205 | 61.3 | 100 |
| 5 | 7.67 | 1,220 | 60.3 | 110 |
| 6 | 7.79 | 1,155 | 59.6 | 125 |
| 7 | 7.64 | 1,170 | 60.6 | 105 |
| 8 | 7.69 | 1,230 | 61.5 | 95 |
| 9 | 7.55 | 1,145 | 62.3 | 90 |
| 10 | 7.61 | 1,250 | 61.1 | 100 |
| 11 | 7.66 | 1,210 | 62.4 | 85 |
| 12 | 7.68 | 1,240 | 60.8 | 120 |

EXAMPLE 13

As in Example 1, a raw mixture consisting of 202.2 g. of PbO, 10.66 g. of BaO, 37.3 g. of $TiO_2$, 67.3 g. of $ZrO_2$, 3.28 g. of $Nb_2O_3$ and 4.76 g. of $Er_2O_3$ was used, burned, moulded into a circular disc having a diameter of 13 mm. and a thickness of 1 mm. and then sintered at a temperature of 1290° C. The sintered disc had a composition consisting of 38.5 mol percent of $PbTiO_3$, 2.5 mol percent of $BaTiO_3$, 5.0 mol percent of $Ba(ErNb)_{0.5}O_3$ and the remainder of $PbZrO_3$, and had the following physical characteristics:

$D=7.79$ g./cm.³
$T_c=289°$ C.
$\epsilon=1680$
$\tan\delta=3.1\%$
$\rho=10^{12}$ ohm-cm.
$Kr=45.3\%$
$Qm=230$

EXAMPLE 14

A mixture consisting of 218.6 g. of PbO, 3.03 g. of BaO, 35.2 g. of $TiO_2$, 67.3 g. of $ZrO_2$, 0.72 g. of $Nb_2O_5$ and 0.88 g. of $Gd_2O_3$ was moulded into a circular disc of 13 mm. diameter and 1 mm. thick after the mixture was burned at temperature of about 800° C., and then sintered at 1260° C. for 90 minutes. The disc shaped piezoelectric ceramic had a composition consisting of 43.5 mol percent of $PbTiO_3$, 1.0 mol percent of $BaTiO_3$, 1.0 mol percent of $Ba(GdNb)_{0.5}O_3$ and the rest of $PbZrO_3$, and had the following characteristics:

$D=7.86$ g./cm.³
$T_c=305°$ C.
$\epsilon=1380$
$\tan\delta=2.9\%$
$\rho=10^{11}$ ohm-cm.
$Kr=51.8\%$
$Qm=125$

What is claimed is:

1. A piezoelectric ceramic selected from the group consisting of materials consisting of from 40 to 50 mol percent of $PbTiO_3$, from 0.5 to 6 mol percent of a compound represented by a general formula $$Ba(MeNb)_{0.5}O_3$$

where Me is an element selected from the group consisting of In, Y, La, Nd, Sm, Eu, Gd, Tb, Dy, Ho, Er, Tm, Yb and Lu, and the remainder of $PbZrO_3$ and such materials wherein a portion of said $PbTiO_3$ is replaced by $BaTiO_3$ in a proportion not exceeding 10 mol percent based on the total quantity of said materials.

2. The piezoelectric ceramic materials according to claim 1 wherein a portion of said $PbTiO_3$ is replaced by $BaTiO_3$ in a proportion not exceeding 10 mol percent based on the total quantity of said materials.

References Cited

UNITED STATES PATENTS 3,068,177 12/1962 Sugden ---------- 252—62.9
3,268,453 8/1966 Ouchi et al. -------- 252—62.9
3,268,783 8/1966 Saburi ---------- 106—39 X TOBIAS E. LEVOW, Primary Examiner J. COOPER, Assistant Examiner U.S. Cl. X.R.

106—39